(12) United States Patent
Sato et al.

(10) Patent No.: US 10,595,393 B2
(45) Date of Patent: Mar. 17, 2020

(54) ELECTRONIC UNIT AND METHOD OF MAKING THE SAME

(71) Applicant: ALPINE ELECTRONICS, INC., Tokyo (JP)

(72) Inventors: Makoto Sato, Fukushima (JP); Hiroki Haraguchi, Fukushima (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 16/411,696

(22) Filed: May 14, 2019

(65) Prior Publication Data

US 2020/0008292 A1 Jan. 2, 2020

(30) Foreign Application Priority Data

Jun. 28, 2018 (JP) .................. 2018-122751

(51) Int. Cl.
*H05K 7/20* (2006.01)
*H05K 1/02* (2006.01)
(Continued)

(52) U.S. Cl.
CPC ..... *H05K 1/0203* (2013.01); *B29C 45/14336* (2013.01); *H03F 1/30* (2013.01); *H03F 3/187* (2013.01); *H05K 1/181* (2013.01); *H05K 3/284* (2013.01); *H05K 7/20854* (2013.01); *B29L 2031/34* (2013.01); *H03F 2200/03* (2013.01); *H05K 2201/066* (2013.01); *H05K 2201/10015* (2013.01); *H05K 2201/10522* (2013.01);
(Continued)

(58) Field of Classification Search
None
See application file for complete search history.

(56) References Cited

U.S. PATENT DOCUMENTS 5,808,868 A * 9/1998 Drekmeier .............. H01L 23/16
165/80.2
5,914,531 A * 6/1999 Tsunoda ................ H01L 21/565
257/668

(Continued)

FOREIGN PATENT DOCUMENTS

| DE | 10 2013 215 368 A1 | 2/2015 |
|---|---|---|
| DE | 10 2015 217 572 B3 | 3/2017 |

(Continued)

OTHER PUBLICATIONS

European Search Report and Annex in connection with corresponding European Patent Application No. 12182273.3 dated Oct. 28, 2019.

*Primary Examiner* — Courtney L Smith
(74) *Attorney, Agent, or Firm* — Brinks Gilson & Lione

(57) ABSTRACT

A digital amplifier integrated circuit ("IC"), which is a heat-generating electronic component, is mounted on an upper surface of an insulating substrate. The digital amplifier IC is disposed inside a recess of a heat sink. The heat sink includes a peripheral wall having an end face placed on the upper surface of the insulating substrate. A hot-melt resin layer, molded by hot-melt molding, covers the upper surface of the insulating substrate. The hot-melt resin layer is in contact with a side face of the peripheral wall and retains the heat sink on the insulating substrate. The recess of the heat sink has no hot-melt resin therein.

9 Claims, 5 Drawing Sheets

(51) Int. Cl.
    *B29C 45/14*     (2006.01)
    *H03F 1/30*     (2006.01)
    *H03F 3/187*     (2006.01)
    *H05K 1/18*     (2006.01)
    *H05K 3/28*     (2006.01)
    *B29L 31/34*     (2006.01)

(52) U.S. Cl.
    CPC ................ *H05K 2203/1316* (2013.01); *H05K 2203/1327* (2013.01)

(56) References Cited

U.S. PATENT DOCUMENTS

| | | | | |
|---|---|---|---|---|
| 7,050,305 | B2* | 5/2006 | Thorum | H05K 5/0013 165/185 |
| 8,184,432 | B2* | 5/2012 | Miyashita | G02F 1/133385 349/58 |
| 8,730,675 | B2* | 5/2014 | Sano | H04M 1/0202 165/104.33 |
| 9,320,183 | B1* | 4/2016 | Nagar | H05K 9/0007 |
| 9,646,910 | B2* | 5/2017 | Ahuja | G06F 1/20 |
| 9,681,565 | B2* | 6/2017 | Escamilla | H05K 5/065 |
| 10,398,021 | B2* | 8/2019 | Avalos | B29C 45/0046 |

FOREIGN PATENT DOCUMENTS

| | | | |
|---|---|---|---|
| EP | 1 677 583 | A1 | 12/2005 |
| WO | 2017-056722 | A1 | 4/2017 |

\* cited by examiner

ELECTRONIC UNIT AND METHOD OF MAKING THE SAME

RELATED APPLICATIONS

The present application claims priority to Japanese Patent Appln. No. 2018-122751, filed Jun. 28, 2018, the entire disclosure of which is hereby incorporated by reference.

BACKGROUND

Field of the Disclosure

The present disclosure relates to an electronic unit in which a heat-generating electronic component and a heat sink that dissipates heat from the heat-generating electronic component are mounted on a substrate and a method of making the electronic unit.

Description of the Related Art

International Publication No. WO 2017/056722 discloses an invention relating to a method of making a vehicle-mounted electronic control device.

According to the invention disclosed in International Publication No. WO 2017/056722, a housing case including a heat sink having radiation fins, an electromagnetic shield, and vehicle fixation members is integrally formed of a single material. A control board on which an electronic component is mounted and connectors are attached to the housing case. As described in paragraph [0022] and the following paragraphs of International Publication No. WO 2017/056722, the method of making the vehicle-mounted electronic control device includes fixing connector sets to the housing case, joining terminals of the connector sets to through-holes of the control board, on which the electronic component is mounted, to form a sub-assembly, setting the sub-assembly into a mold, and injecting hot-melt sealing resin into the mold.

The above-described method allows the completed vehicle-mounted electronic control device to have a structure in which the control board, on which the electronic component is mounted, is retained by the sealing resin within the housing case as illustrated in, for example, FIG. 2(h) of International Publication No. WO 2017/056722.

In the structure of the vehicle-mounted electronic control device made using the above-described method disclosed in International Publication No. WO 2017/056722, the housing case including, as part of, the heat sink is filled with the sealing resin, and the control board on which the electronic component is mounted is completely covered with the sealing resin. In this structure, heat from the electronic component is transferred to the housing case through the sealing resin. This indicates that radiation efficiency is not good. Since the electronic component is in contact with the hot-melt sealing resin, if the electronic component generates heat having a temperature above a guaranteed temperature of the hot-melt sealing resin, the hot-melt sealing resin may deteriorate. Disadvantageously, the deterioration causes, for example, a reduction in adhesion of the hot-melt sealing resin.

SUMMARY

The present disclosure is intended to overcome the above-described disadvantages. It is an object of the present disclosure to provide an electronic unit in which a heat-generating electronic component covered by a heat sink is not in contact with a hot-melt resin layer, the heat sink is retained on a substrate by the hot-melt resin layer, and enhanced radiation of heat from the electronic component is achieved, and to provide a method of making the electronic unit.

The present disclosure provides an electronic unit including a substrate, a heat-generating electronic component mounted on the substrate, a heat sink disposed on the heat-generating electronic component, and a hot-melt resin layer disposed on the substrate. The heat sink includes an upper part that serves as a radiating portion and a lower part that has a recess facing downward and that includes a peripheral wall surrounding the recess and having an end face and a side face. The recess of the heat sink covers the heat-generating electronic component. The end face of the peripheral wall of the heat sink is placed on a surface of the substrate. The hot-melt resin layer covers at least part of the surface of the substrate and at least part of the side face of the peripheral wall of the heat sink. The peripheral wall separates the heat-generating electronic component from the hot-melt resin layer.

In some implementations, the heat sink may be fixed to the surface of the substrate by adhesion of the hot-melt resin layer.

In some implementations, the end face of the peripheral wall may be placed on the surface of the substrate with an adhesive layer in between, and the hot-melt resin layer may retain the heat sink on the substrate with a force greater than a force with which the adhesive layer retains the heat sink on the substrate.

In some implementations, preferably, the substrate has a communication path through which a space inside the recess of the heat sink communicates with a side of the substrate remote from the surface of the substrate.

The present disclosure further provides a method of making an electronic unit. In one form, the method includes the steps of (a) preparing a substrate on which a heat-generating electronic component is mounted and a heat sink including an upper part that serves as a radiating portion and a lower part that has a recess facing downward and includes a peripheral wall surrounding the recess and having an end face and a side face, (b) setting the heat sink and the substrate into a mold such that the recess covers the heat-generating electronic component and the end face of the peripheral wall of the heat sink is placed on a surface of the substrate, and (c) injecting melted hot-melt resin into a cavity in the mold to form a hot-melt resin layer that covers at least part of the surface of the substrate and at least part of the side face of the peripheral wall of the heat sink.

In some implementations, the peripheral wall may separate the heat-generating electronic component from the hot-melt resin layer.

In some implementations, the heat sink may be fixed to the surface of the substrate by adhesion of the hot-melt resin layer.

In some implementations, in step (b), the radiating portion of the heat sink may be positioned outside the cavity in the mold. Further, in step (c), the hot-melt resin injected into the cavity may be in contact with the side face of the peripheral wall without being in contact with the radiating portion.

In some implementations, in step (b), the end face of the peripheral wall is placed on the surface of the substrate with an adhesive layer in between. In some implementations, the hot-melt resin layer retains the heat sink on the substrate with a force greater than a force with which the adhesive layer retains the heat sink on the substrate.

In forms of the electronic unit according to the present disclosure, since the hot-melt resin layer is not in contact with the heat-generating electronic component located inside the recess of the heat sink, heat from the heat-generating electronic component can be effectively transferred to the heat sink, thus increasing the effect of heat radiation. This reduces or eliminates the likelihood that the hot-melt resin layer may deteriorate due to heat from the heat-generating electronic component. Furthermore, the heat sink can be fixed to the substrate by adhesion of the hot-melt resin layer. This eliminates the need for screwing or soldering the heat sink to the surface of the substrate.

In forms of the method according to the present disclosure, the heat sink and the substrate are set into the mold such that the end face of the peripheral wall of the heat sink is placed on the substrate, and the hot-melt resin is injected into the cavity in the mold such that the hot-melt resin is in contact with the surface of the substrate and the side face of the peripheral wall, so that the heat sink can be retained on the substrate by adhesion of the hot-melt resin layer. In other words, the heat sink can be fixed to the substrate by hot-melt molding. Furthermore, a structure in which the hot-melt resin is prevented from entering the recess of the heat sink can be achieved.

DETAILED DESCRIPTION OF THE DRAWINGS

Figure 1:
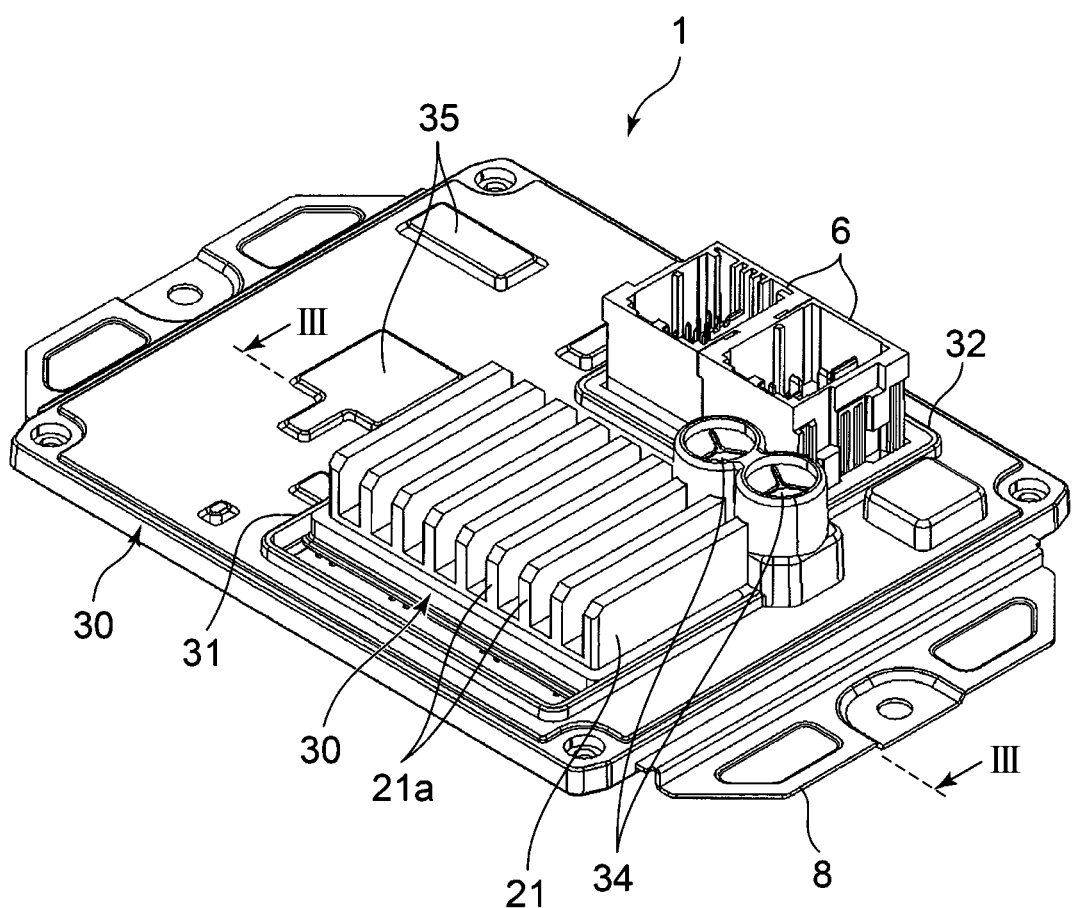
FIG. 1 is a perspective view of an electronic unit.

FIG. 1 illustrates one form of an electronic unit 1 according to the present disclosure. The electronic unit 1 is a vehicle-mounted audio amplifier including a digital amplifier.

Figure 2:
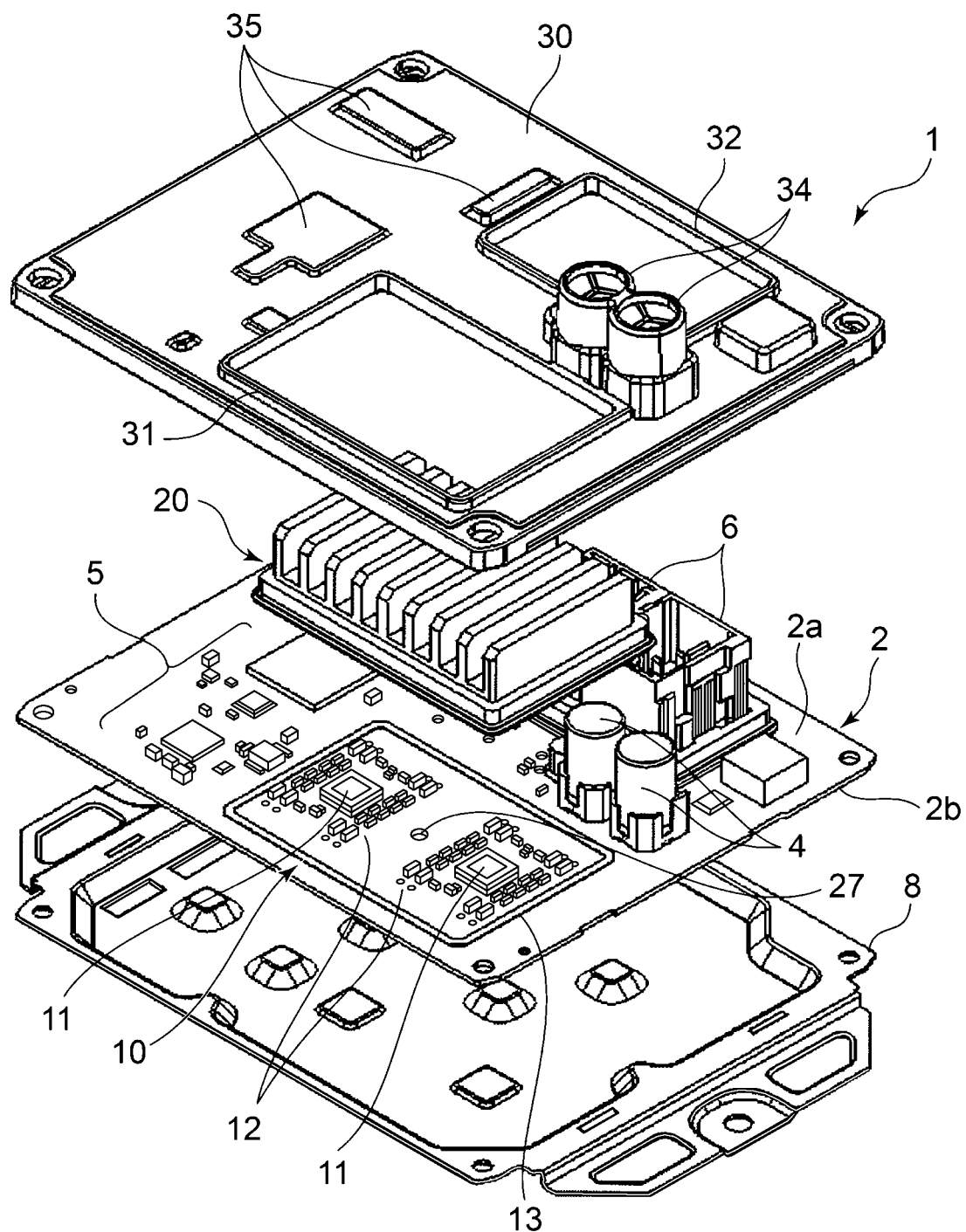
FIG. 2 is an exploded perspective view of the electronic unit of FIG. 1 and illustrates a substrate, a heat sink, a hot-melt resin layer, and a reinforcing metal plate.

FIG. 2 is an exploded perspective view of the electronic unit 1. As illustrated in FIG. 2, the electronic unit 1 includes an insulating substrate 2. The insulating substrate 2 has an upper surface 2a facing upward in FIG. 2 and a lower surface 2b facing downward in FIG. 2. The terms "upper" or "upward" and "lower" or "downward" as used herein refer to directions relative to the electronic unit 1. As illustrated in FIG. 2, the lower surface 2b of the insulating substrate 2 is superposed on a reinforcing metal plate 8. The insulating substrate 2 and the reinforcing metal plate 8 are fixed to each other by using screws, for example.

Figure 3:
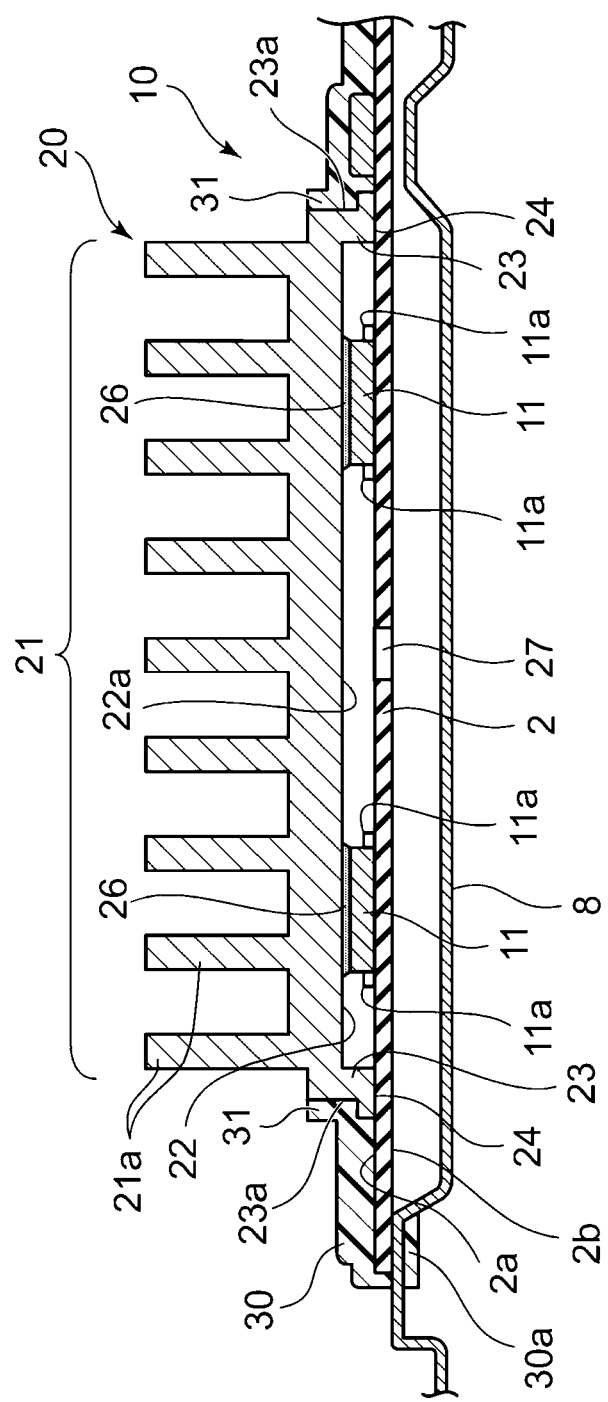
FIG. 3 is an enlarged sectional view of part of the electronic unit of FIG. 1 taken along line III-III in FIG. 1 and illustrates an amplifier mounting area.

Different kinds of electronic components are mounted on the upper surface 2a of the insulating substrate 2. The upper surface 2a of the insulating substrate 2 has an amplifier mounting area 10. Two digital amplifier integrated circuits (ICs) 11, serving as heat-generating electronic components, are mounted in the amplifier mounting area 10. As illustrated in FIG. 3, terminals 11a extend from sides of the digital amplifier ICs 11. The terminals 11a are soldered to conductors arranged on the upper surface 2a of the insulating substrate 2. Furthermore, chip parts 12 necessary for the amplifier circuits are soldered to and mounted in the amplifier mounting area 10 such that the digital amplifier ICs 11 are surrounded by the chip parts 12.

A heat sink 20 is disposed in the amplifier mounting area 10 of the insulating substrate 2. The heat sink 20 is made of metal having high thermal conductivity, such as aluminum or aluminum alloy. As illustrated in FIG. 3, the heat sink 20 includes, as upper part, a radiating portion 21. The radiating portion 21 includes a plurality of radiating fins 21a spaced apart from each other. The heat sink 20 has a recess 22 opening downward or facing the insulating substrate 2. The recess 22 serves as a space for containing the digital amplifier ICs 11, which are heat-generating electronic components.

The heat sink 20 includes, as lower part, a peripheral wall 23 surrounding the recess 22. The heat sink 20 has a rectangular shape in plan view, and the peripheral wall 23 continuously extends along four sides of the rectangular shape. The peripheral wall 23 has a side face 23a facing outward and an end face 24 facing downward. The end face 24 is a flat face continuously extending around the recess 22.

The heat sink 20 is disposed on the insulating substrate 2 such that the recess 22 covers the two digital amplifier ICs 11 and the chip parts 12 and the whole of the end face 24 of the peripheral wall 23 is in contact with the upper surface 2a. Since the end face 24 is flat and the upper surface 2a of the insulating substrate 2 is also flat, the arrangement of the entire end face 24 and the upper surface 2a in contact with each other enables the inside of the recess 22 to be separated from a space outside the heat sink 20. As illustrated in FIG. 2, in some implementations the electronic unit 1 includes an interposer 13 disposed between the upper surface 2a of the insulating substrate 2 and the end face 24 of the peripheral wall 23. The interposer 13 is an adhesive layer formed of a double-faced adhesive tape stuck to the upper surface 2a or an adhesive applied to the upper surface 2a. The interposer 13 can be used as an adhesive layer to position and temporarily fasten the heat sink 20 onto the insulating substrate 2, and can also be used to fill a gap between the upper surface 2a of the insulating substrate 2 and the end face 24 of the peripheral wall 23 of the heat sink 20.

The interposer 13 is used to position and temporarily fasten the heat sink 20 and fill the gap. The interposer 13 is not intended to firmly fix the heat sink 20 to the insulating substrate 2. The interposer 13, therefore, may be a non-adhesive foamed resin sheet, paper sheet, or fabric sheet, for example. If the upper surface 2a of the insulating substrate 2 in the amplifier mounting area 10 has high flatness and the end face 24 of the peripheral wall 23 is in contact with the upper surface 2a with no gap in between, the interposer 13 may be omitted.

Referring to FIG. 2, other electronic components are mounted on the upper surface 2a of the insulating substrate 2 in addition to the digital amplifier ICs 11, serving as heat-generating electronic components, and the chip parts 12 arranged around the ICs 11. The other electronic components include two electrolytic capacitors 4 and electronic parts 5. Each of the electrolytic capacitors 4 includes a metal case and a terminal extending downward from the bottom of the metal case. The terminals of the electrolytic capacitors 4 extend through through-holes of the insulating substrate 2 and are soldered to a conducting layer on the lower surface 2b of the insulating substrate 2. The electronic parts 5 include ICs and various chip type parts. Terminals and electrodes of the ICs and the chip type parts are soldered to a conducting layer on the upper surface 2a of the insulating substrate 2. Two connectors 6 are mounted on the upper surface 2a of the insulating substrate 2. Each of the connectors 6 includes a plurality of terminals extending downward from its bottom. The terminals of the connectors 6 extend through through-holes of the insulating substrate 2 and are soldered to the conducting layer on the lower surface 2b of the insulating substrate 2.

As illustrated in FIGS. 1 and 2, the electronic unit 1 includes a hot-melt resin layer 30. The hot-melt resin layer 30 is formed of polyester-based hot-melt resin, which is an adhesive thermoplastic resin, or a hot-melt adhesive. The hot-melt resin layer 30 has a three-dimensional shape because it is formed by hot-melt molding. For convenience of explanation, the molded hot-melt resin layer 30 is separated from the surface of the insulating substrate 2 in FIG. 2. As illustrated in FIG. 1, however, the hot-melt resin layer 30 is actually in tight contact with the upper surface 2a of the insulating substrate 2 to cover substantially the whole of the upper surface 2a. Furthermore, part 30a of the hot-melt resin layer 30 extends to the lower surface 2b of the insulating substrate 2 as illustrated in FIG. 3.

The hot-melt resin layer 30 includes a heat sink cover 31. As illustrated in FIGS. 1 and 3, the heat sink cover 31 is in tight contact with the side face 23a of the peripheral wall 23 of the heat sink 20 to cover the side face 23a. It is only required that the heat sink cover 31 is in tight contact with the side face 23a of the peripheral wall 23 to cover at least part of the side face 23a. It is preferred that the heat sink cover 31 be in tight contact with the side face 23a along the perimeter of the peripheral wall 23. The heat sink cover 31 is in tight contact with the side face 23a of the peripheral wall 23 of the heat sink 20, but is not in contact with the radiating fins 21a of the radiating portion 21. Since the end face 24 of the peripheral wall 23 is in contact with the upper surface 2a of the insulating substrate 2, the hot-melt resin layer 30 is kept out of the recess 22 of the heat sink 20 and is thus not in contact with the digital amplifier ICs 11, serving as heat-generating electronic components. In other words, the peripheral wall 23 of the heat sink 20 separates the digital amplifier ICs 11, serving as heat-generating electronic components, from the hot-melt resin layer 30.

The hot-melt resin layer 30 is formed of a hot-melt adhesive. The hot-melt resin layer 30 is secured to the upper surface 2a of the insulating substrate 2. The heat sink cover 31 continuously extending from the hot-melt resin layer 30 is secured to the side face 23a of the peripheral wall 23 of the heat sink 20. Consequently, the heat sink 20 is fixed to the upper surface 2a of the insulating substrate 2 by adhesion of the hot-melt resin layer 30.

As illustrated in FIG. 2, in the case where the interposer 13 disposed between the upper surface 2a of the insulating substrate 2 and the end face 24 of the peripheral wall 23 of the heat sink 20 is the adhesive layer formed of, for example, a double-faced adhesive tape, the hot-melt resin layer 30 retains the heat sink 20 on the upper surface 2a of the insulating substrate 2 with a force sufficiently greater than a force with which the adhesive layer retains the heat sink 20 on the upper surface 2a of the insulating substrate 2. In other words, a force required to separate the heat sink 20 fixed to the upper surface 2a of the insulating substrate 2 with only the hot-melt resin layer 30 without any adhesive layer vertically upward from the upper surface 2a is sufficiently greater than a force required to separate the heat sink 20 temporarily fastened to the upper surface 2a of the insulating substrate 2 with only the adhesive layer vertically upward from the upper surface 2a.

As illustrated in FIG. 3, upper surfaces of the digital amplifier ICs 11, serving as heat-generating electronic components, and an upper inner surface 22a of the recess 22 of the heat sink 20 form a small gap therebetween. This gap is filled with silicone grease 26. This facilitates heat transfer from the digital amplifier ICs 11 to the heat sink 20 through the silicone grease 26. As illustrated in FIGS. 2 and 3, the amplifier mounting area 10 has a through-hole, serving as a communication path 27, extending between the upper and lower surfaces of the insulating substrate 2. A space inside the recess 22 of the heat sink 20 communicates with a space defined between the lower surface 2b of the insulating substrate 2 and the reinforcing metal plate 8 through the communication path 27. This arrangement prevents the space inside the recess 22 from abnormally increasing in temperature due to heat generated from the digital amplifier ICs 11. Furthermore, this arrangement reduces or eliminates an abnormal increase in internal pressure of the recess 22 caused by an increase in temperature of the space inside the recess 22.

As illustrated in FIGS. 1 and 2, the hot-melt resin layer 30 includes a connector cover 32 covering bases of the connectors 6. The hot-melt resin layer 30 further includes electrolytic-capacitor covers 34 covering the entire surfaces of the two electrolytic capacitors 4 and electronic-part covers 35 covering the entire surfaces of the electronic parts 5. In other words, the hot-melt resin layer 30 covers the electronic components other than the digital amplifier ICs 11, serving as heat-generating electronic components, and the chip parts 12 arranged around the ICs on the upper surface 2a of the insulating substrate 2.

The electronic unit 1 of FIG. 1 is used as a vehicle-mounted audio amplifier. In the electronic unit 1, the upper surface 2a of the insulating substrate 2, the entire surfaces of the electrolytic capacitors 4, and the entire surfaces of the electronic parts 5 are covered by the hot-melt resin layer 30. As illustrated in FIG. 3, the digital amplifier ICs 11 and the chip parts 12 surrounding the ICs in the amplifier mounting area 10 are arranged inside the recess 22 of the heat sink 20. The bases of the connectors 6 are also covered by the hot-melt resin layer 30. Such a configuration ensures water resistance across the upper surface 2a of the insulating substrate 2. This eliminates the need for a housing for containing the electronic unit 1. The electronic unit 1 can be installed in a small space, such as a space inside an instrument panel of a vehicle, a space inside a door of a vehicle, or a space under a seat of a vehicle, without being contained in a housing, or with having an appearance in FIG. 1.

A method of making the electronic unit 1 will now be described with reference to FIGS. 4A to 4D.

The hot-melt resin layer 30 of the electronic unit 1 is formed by hot-melt molding.

Figure 4A:
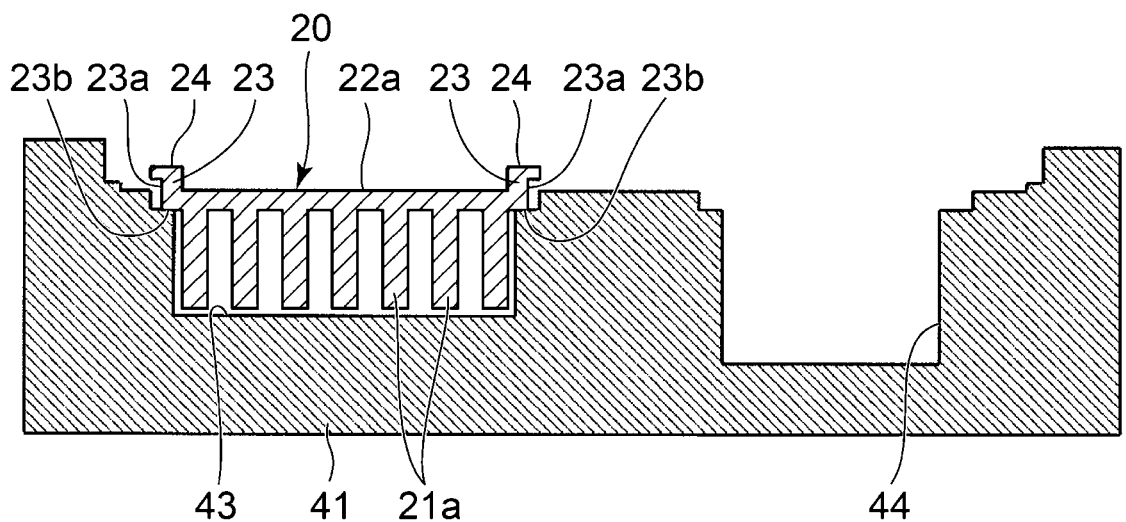
FIG. 4A illustrates a method of making the electronic unit of FIG. 1 and is a sectional view illustrating a step of setting a heat sink into a mold.
Figure 4B:
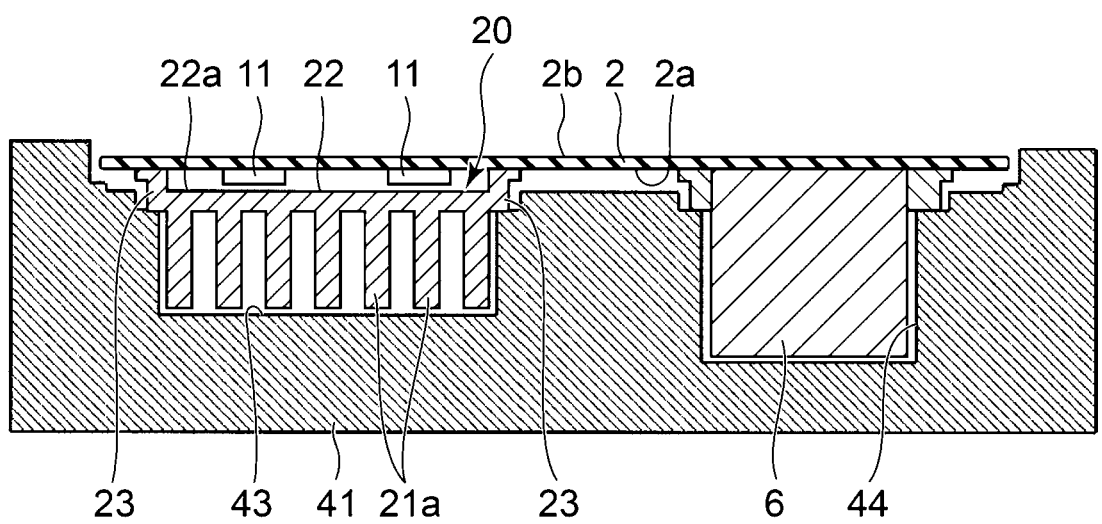
FIG. 4B illustrates the method of making the electronic unit of FIG. 1 and is a sectional view illustrating a step of further setting an insulating substrate, on which connectors and electronic components are mounted, into the mold in which the heat sink is set.
Figure 4C:
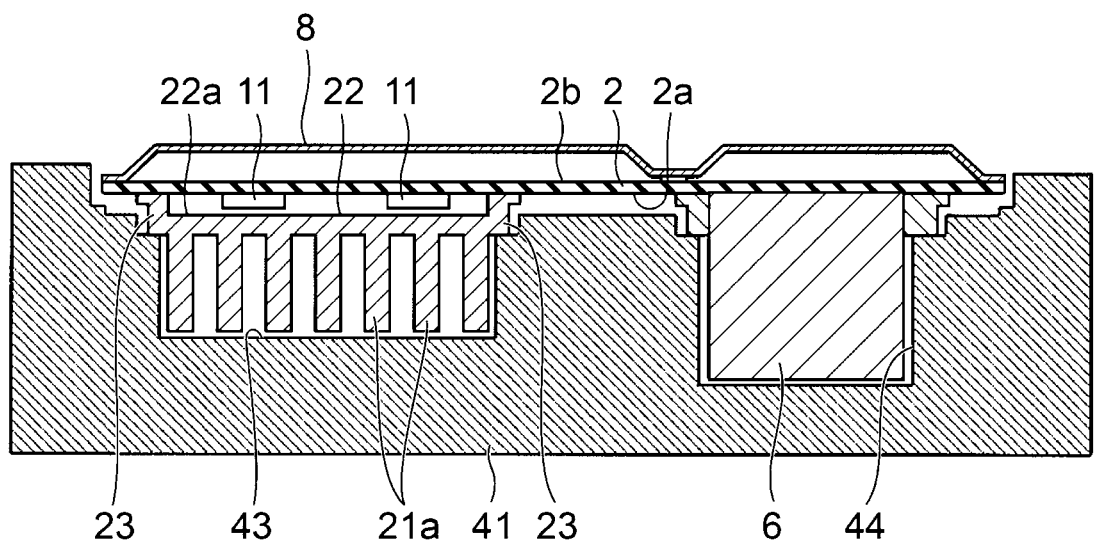
FIG. 4C illustrates the method of making the electronic unit of FIG. 1 and is a sectional view illustrating a step of fixing a reinforcing metal plate to the insulating substrate.
Figure 4D:
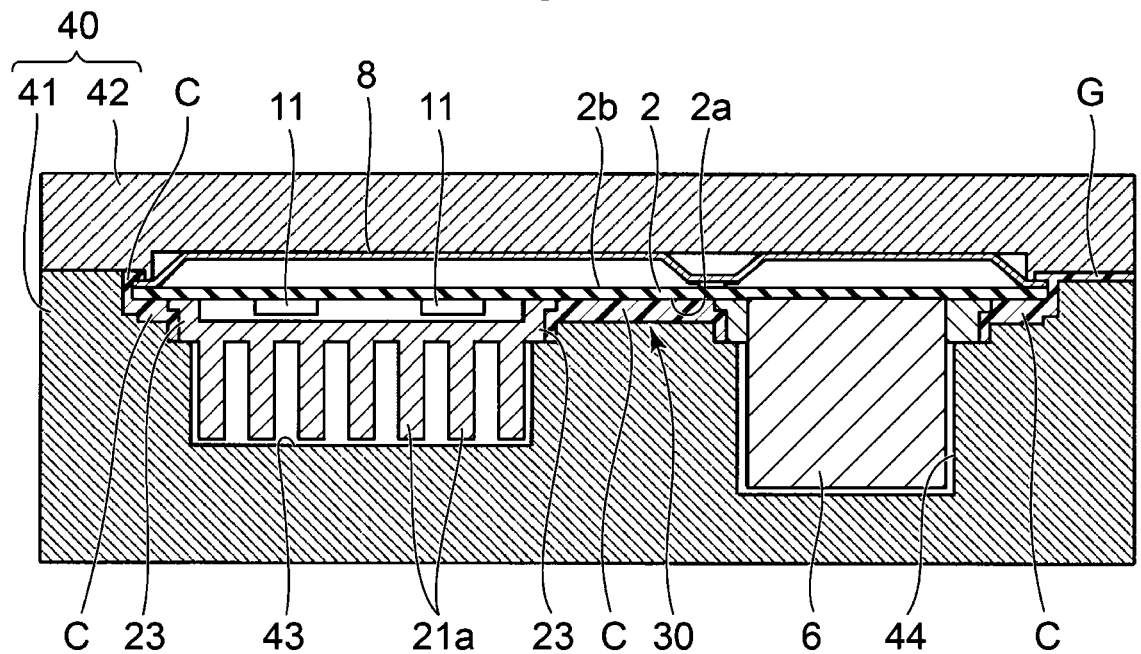
FIG. 4D illustrates the method of making the electronic unit of FIG. 1 and is a sectional view illustrating a step of injecting hot-melt resin into a cavity in the mold.

As illustrated in FIG. 4D, a mold 40 is used for hot-melt molding. The mold 40 includes a first mold component (lower mold component) 41 and a second mold component (upper mold component) 42.

As illustrated in FIG. 4A, the first mold component 41 has a heat sink receiving recess 43 and a connector receiving recess 44. The first mold component 41 further has recesses for receiving the electrolytic capacitors 4 and the electronic parts 5.

In a step illustrated in FIG. 4A, the heat sink 20 is set into the heat sink receiving recess 43. In setting the heat sink 20 into the first mold component 41, the radiating portion 21 including the radiating fins 21a is inserted into the heat sink receiving recess 43, and an upper end face 23b of the peripheral wall 23 of the heat sink 20 is placed against a flat portion, surrounding the heat sink receiving recess 43, of the first mold component 41 such that the end face 24 of the peripheral wall 23 faces upward.

The digital amplifier ICs 11, the chip parts 12, and the electronic parts 5 are mounted onto the upper surface 2a of the insulating substrate 2 by soldering such that the chip parts 12 surround the digital amplifier ICs 11. In addition, the two electrolytic capacitors 4 and the two connectors 6 are mounted onto the upper surface 2a. In a step illustrated in FIG. 4B, the insulating substrate 2 on which the electronic components are mounted is set into the first mold component 41. At this time, the upper surface 2a of the insulating substrate 2 is allowed to face the first mold component 41, and the digital amplifier ICs 11, serving as heat-generating electronic components, and the chip parts 12 in the amplifier mounting area 10 are inserted into the recess 22 of the heat sink 20. The upper surface 2a of the insulating substrate 2 is positioned and temporarily fastened to the end face 24 of the peripheral wall 23 of the heat sink 20 with the interposer 13 in between. At this time, the connectors 6 are placed into the connector receiving recess 44 of the first mold component 41, and the electrolytic capacitors 4 and the electronic parts 5 are placed into the recesses of the first mold component 41.

Then, in a step illustrated in FIG. 4C, the reinforcing metal plate 8 is fixed to the lower surface 2b of the insulating substrate 2 set in the first mold component 41. Alternatively, the insulating substrate 2 and the reinforcing metal plate 8 may be previously fixed to each other, and after that, the insulating substrate 2 and the reinforcing metal plate 8 fixed to each other may be set into the first mold component 41 as illustrated in FIG. 4C.

In a step illustrated in FIG. 4D, the first mold component 41 and the second mold component 42 are joined together. In the joining, a cavity C is formed between the upper surface 2a of the insulating substrate 2 and the first mold component 41, and another cavity is also formed in the vicinity of the reinforcing metal plate 8 fixed to the insulating substrate 2. Furthermore, a gate G is formed at the interface between the first mold component 41 and the second mold component 42. The insulating substrate 2 is set in the mold 40 such that the radiating portion 21 of the heat sink 20 is not exposed in the cavity C, the connectors 6 are also not exposed in the cavity C, and the radiating portion 21 and the connectors 6 are located outside the cavity C. Heated, melted adhesive hot-melt resin is injected into the cavity C through the gate G under low pressure conditions, and is cooled and cured, thereby forming the hot-melt resin layer 30 having a three-dimensional shape as illustrated in FIGS. 1 and 2.

In implementations of the method of making the electronic unit 1, since the hot-melt resin layer 30 is molded by holt-melt molding, the surfaces of the electrolytic capacitors 4, the surfaces of the electronic parts 5, and the bases of the connectors 6 can be covered with the hot-melt resin layer 30 in one step. In addition, since the side face 23a of the peripheral wall 23 of the heat sink 20, temporarily fastened to the upper surface 2a of the insulating substrate 2 with the interposer 13, and the upper surface 2a of the insulating substrate 2 are in tight contact with the adhesive holt-melt resin, the heat sink 20 can be firmly fixed to the insulating substrate 2 by using the hot-melt resin layer 30. Consequently, the electronic unit 1, as a whole, exhibiting excellent water resistance can be provided. In addition, the peripheral wall 23 of the heat sink 20 achieves separation of the digital amplifier ICs 11 from the hot-melt resin layer 30 such that the digital amplifier ICs 11 are not in contact with the hot-melt resin layer 30.

In implantations of the electronic unit 1 made using the above-described method, as illustrated in FIG. 3, the digital amplifier ICs 11, serving as heat-generating electronic components, are located inside the recess 22 of the heat sink 20, and the hot-melt resin layer 30 is not in contact with the digital amplifier ICs 11. This arrangement allows effective heat transfer from the digital amplifier ICs 11 to the heat sink 20. In addition, since the digital amplifier ICs 11 are not in contact with the hot-melt resin layer 30, the hot-melt resin layer 30 is unlikely to deteriorate due to heat. Additionally, the communication path 27 of the insulating substrate 2 allows heat in the recess 22 to escape from the recess 22. This eliminates an abnormal increase in internal pressure of the recess 22.

What is claimed is:

1. An electronic unit comprising:
   a substrate;
   a heat-generating electronic component mounted on a heat-generating electronic component mounted area of the substrate;
   other electronic components mounted on an outside of the heat-generating electronic component mounted area of the substrate;
   a heat sink disposed on the heat-generating electronic component; and
   a hot-melt resin layer disposed on at least one of the other electronic components,
   wherein the heat sink includes an upper part that serves as a radiating portion and a lower part that has a recess facing downward and that includes a peripheral wall surrounding the recess and having an end face and a side face, the recess of the heat sink covering the heat-generating electronic component, and the end face of the peripheral wall of the heat sink placed on a surface of the substrate,
   wherein the hot-melt resin layer continuously covers at least part of the surface of the outside of the heat-generating electronic component mounted area of the substrate and at least part of the side face of the peripheral wall of the heat sink, and
   wherein the peripheral wall separates the heat-generating electronic component from the hot-melt resin layer.

2. The unit according to claim 1, wherein the heat sink is fixed to the surface of the substrate by adhesion of the hot-melt resin layer.

3. The unit according to claim 2,
   wherein the end face of the peripheral wall is placed on the surface of the substrate with an adhesive layer in between, and
   wherein the hot-melt resin layer retains the heat sink on the substrate with a force greater than a force with which the adhesive layer retains the heat sink on the substrate.

4. The unit according to claim 1, wherein the substrate has a communication path through which a space inside the recess of the heat sink communicates with a side of the substrate remote from the surface of the substrate.

5. A method of making an electronic unit, the method comprising the steps of:
(a) preparing a substrate on which a heat-generating electronic component is mounted on a heat-generating electronic component mounted area and other electronic components are mounted on an outside of the heat-generating electronic component mounted area and a heat sink including an upper part that serves as a radiating portion and a lower part that has a recess facing downward and including a peripheral wall surrounding the recess and having an end face and a side face;
(b) setting the heat sink and the substrate into a mold such that the recess covers the heat-generating electronic component and the end face of the peripheral wall of the heat sink is placed on a surface of the substrate; and
(c) injecting melted hot-melt resin into a cavity in the mold to form a hot-melt resin layer that continuously covers at least part of the surface of the outside of the heat-generating electronic component mounted area of the substrate and at least part of the side face of the peripheral wall of the heat sink.

6. The method according to claim 5, wherein the peripheral wall separates the heat-generating electronic component from the hot-melt resin layer.

7. The method according to claim 5, wherein the heat sink is fixed to the surface of the substrate by adhesion of the hot-melt resin layer.

8. The method according to claim 5,
wherein in the step (b), the radiating portion of the heat sink is positioned outside the cavity in the mold, and
wherein in the step (c), the hot-melt resin injected into the cavity is in contact with the side face of the peripheral wall without being in contact with the radiating portion.

9. The method according to claim 5,
wherein in the step (b), the end face of the peripheral wall is placed on the surface of the substrate with an adhesive layer in between, and
wherein the hot-melt resin layer retains the heat sink on the substrate with a force greater than a force with which the adhesive layer retains the heat sink on the substrate.

* * * * *